US011139139B2

(12) United States Patent
Morita et al.

(10) Patent No.: US 11,139,139 B2
(45) Date of Patent: Oct. 5, 2021

(54) CHARGED PARTICLE BEAM GENERATOR AND CHARGED PARTICLE BEAM APPARATUS

(71) Applicant: Hitachi High-Tech Corporation, Tokyo (JP)

(72) Inventors: Hiroshi Morita, Tokyo (JP); Shinichi Kato, Tokyo (JP); Hiroyuki Ito, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/252,124

(22) PCT Filed: Jun. 28, 2018

(86) PCT No.: PCT/JP2018/024493
§ 371 (c)(1),
(2) Date: Dec. 14, 2020

(87) PCT Pub. No.: WO2020/003428
PCT Pub. Date: Jan. 2, 2020

(65) Prior Publication Data
US 2021/0257178 A1    Aug. 19, 2021

(51) Int. Cl.
*H01J 37/07* (2006.01)
*H01J 37/248* (2006.01)

(52) U.S. Cl.
CPC ............ *H01J 37/07* (2013.01); *H01J 37/248* (2013.01); *H01J 2237/0206* (2013.01)

(58) Field of Classification Search
CPC .. H01J 35/06; H01J 35/16; H01J 37/06; H01J 37/067; H01J 37/07; H01J 37/073;
(Continued)

(56) References Cited

U.S. PATENT DOCUMENTS

| 4,369,861 A * | 1/1983 | Rietman | B66F 9/082 |
| | | | 187/226 |
| 5,962,995 A * | 10/1999 | Avnery | H01J 3/027 |
| | | | 250/492.3 |
| 2013/0264496 A1* | 10/2013 | Arai | H01J 37/08 |
| | | | 250/489 |

FOREIGN PATENT DOCUMENTS

| JP | 49-115261 A | 11/1974 |
| JP | 53-62977 A | 6/1978 |

(Continued)

OTHER PUBLICATIONS

International Search Report (PCT/ISA/210) issued in PCT Application No. PCT/JP2018/024493 dated Sep. 25, 2018 with English translation (three (3) pages).

(Continued)

*Primary Examiner* — David E Smith
(74) *Attorney, Agent, or Firm* — Crowell & Moring LLP (57) ABSTRACT

Provided are a charged particle beam generator and a charged particle beam device that can improve insulation reliability as a result of reducing the high electric field generated around a connection section for a conductor. The charged particle beam generator 100 has: a plug 151 that guides high voltage from outside to a charged particle source that is in a vacuum; and a socket 251 having the charged particle source attached thereto. An electric field reduction ring 161 that electrically connects to one of a plurality of conductors that guide high voltage is embedded inside the tip of the plug 151. The plurality of conductors that guide the high voltage are arranged so as to penetrate the electric field reduction ring 161.

14 Claims, 6 Drawing Sheets

(58) Field of Classification Search
CPC .. H01J 37/16; H01J 37/248; H01J 2237/0203; H01J 2237/0206
See application file for complete search history.

(56) References Cited

FOREIGN PATENT DOCUMENTS

| | | | |
|---|---|---|---|
| JP | 61-99958 | U | 6/1986 |
| JP | 3-133040 | A | 6/1991 |
| JP | 2002-25484 | A | 1/2002 |
| JP | 2017-204342 | A | 11/2017 |
| JP | 2017204342 | A * | 11/2017 |

OTHER PUBLICATIONS

Japanese-language Written Opinion (PCT/ISA/237) issued in PCT Application No. PCT/JP2018/024493 dated Sep. 25, 2018 (three (3) pages).

* cited by examiner

CHARGED PARTICLE BEAM GENERATOR AND CHARGED PARTICLE BEAM APPARATUS

TECHNICAL FIELD

The present invention relates to a charged particle beam generator for irradiating a sample with a charged particle beam and a charged particle beam apparatus including the charged particle beam generator.

BACKGROUND ART

For example, an electron microscope included in the charged particle beam apparatus includes a thermionic gun, a Schottky electron gun, or a field emission electron gun as an electron beam generator (electron gun).

Figure 4:
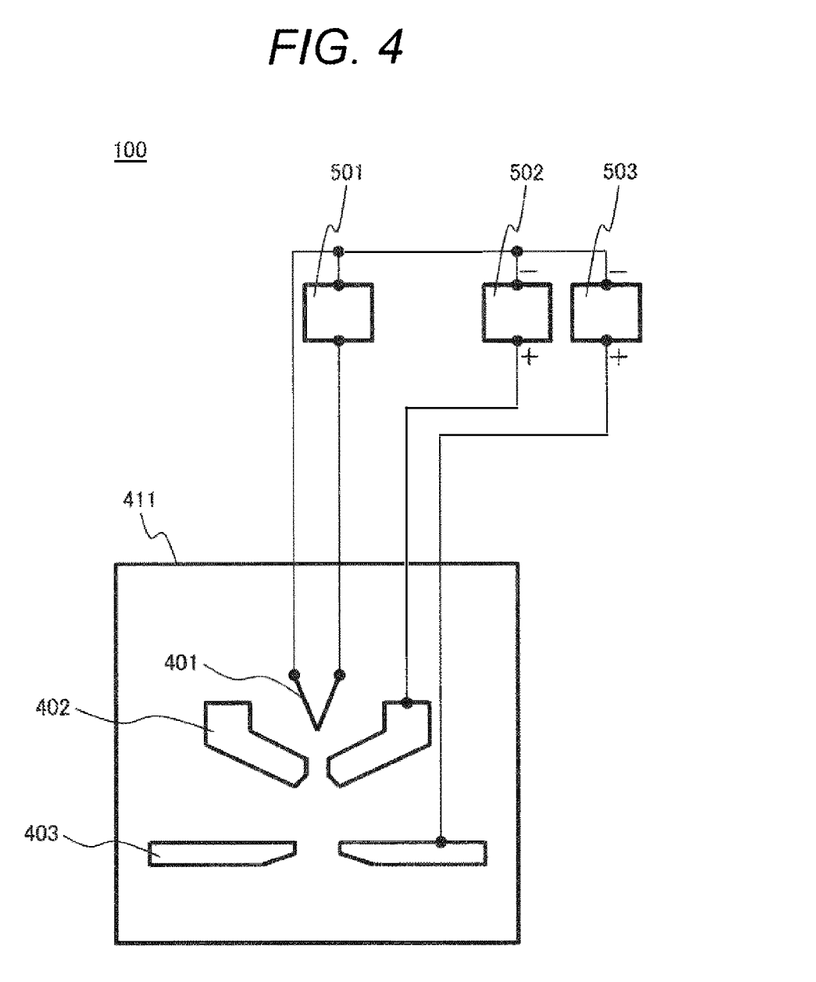
FIG. 4 is a diagram showing an electric circuit in a thermionic gun.

A thermionic gun utilizing thermionic emission uses a tungsten filament or LaB6 (lanthanum hexaboride) as an emitter. Although inferior in performance such as brightness and energy width to field emission electron guns and Schottky electron guns, the thermionic gun is superior in probe current amount, current stability, price, and the like. FIG. 4 is a diagram showing an electric circuit of the thermionic gun. As shown in FIG. 4, the emitter 401, the Wehnelt cylinder 402, and the anode 403 are stored in a vacuum container 411. The emitter 401 is heated to approximately 2500° C. in the case of tungsten and approximately 1600° C. in the case of LaB6 by being energized with the current generated by a heating power source 501. A DC voltage of the extraction power source 502 is applied to the Wehnelt cylinder 402, and an electric field is generated between the emitter 401 and the Wehnelt cylinder 402. The thermoelectrons generated in the emitter 401 are extracted by this electric field. Furthermore, the DC voltage of an acceleration power source 503 is applied to the anode 403, and thermoelectrons are accelerated by the electric field generated by the anode 403.

Figure 5:
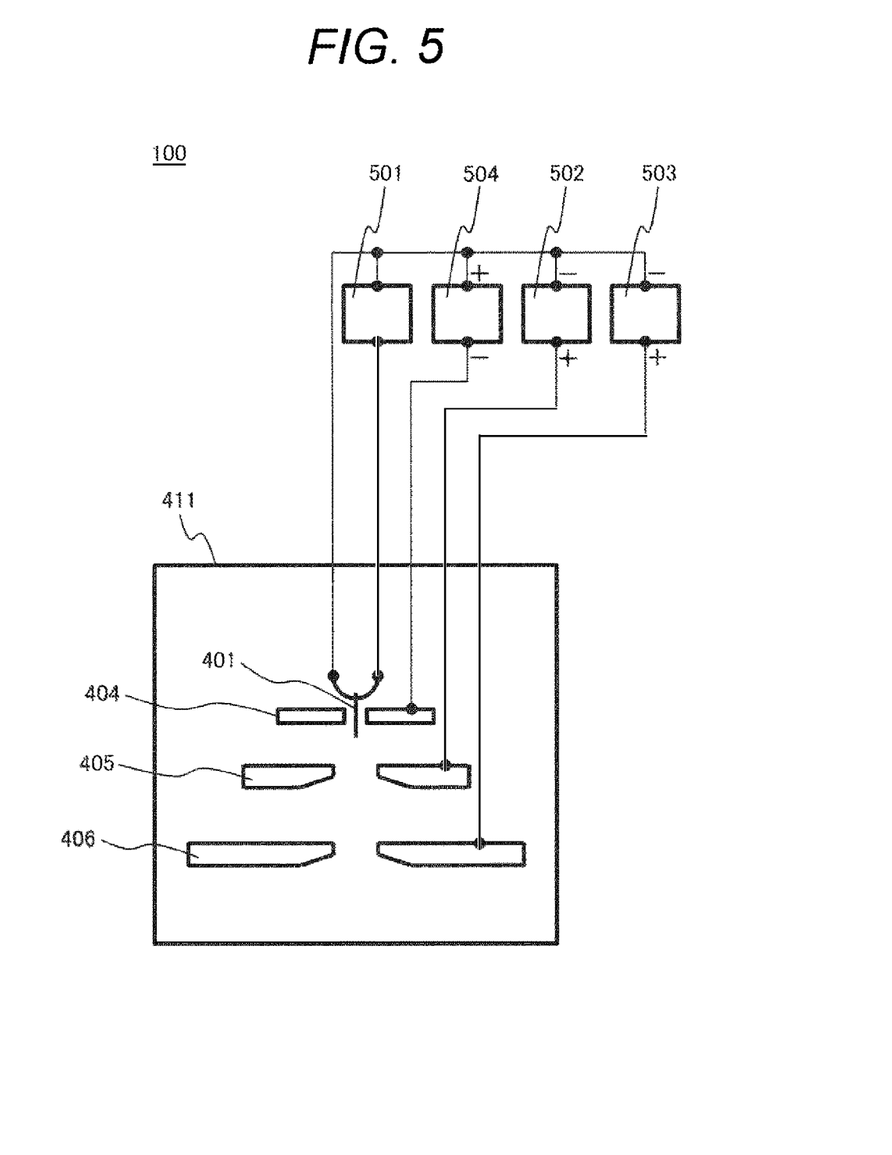
FIG. 5 is a diagram showing an electric circuit in a Schottky electron gun.

In a Schottky electron gun utilizing Schottky emission, a ZrO/W emitter is used as the emitter. The Schottky electron gun has higher brightness and also a smaller electron source than a thermionic gun. Over the field emission electron gun, since the emitter is heated to 1500° C., the Schottky electron gun has superiority such as high current stability, obtaining large probe current, and permitting slightly higher operating pressure. FIG. 5 is a diagram showing an electric circuit in the Schottky electron gun. As shown in FIG. 5, the emitter 401, a suppressor 404, an extraction electrode 405, and an acceleration electrode 406 are stored in a vacuum container 411. The emitter 401 is heated to approximately 1800° C. by being energized with the current generated by the heating power source 501. A voltage by the suppressor power source 504 is applied to the suppressor 404, a voltage by an extraction power source 502 is applied to the extraction electrode 405, and an electric field is applied to the emitter 401 in a heated state. At that time, electrons are generated from the emitter 401 due to the Schottky effect. Furthermore, the DC voltage of the acceleration power source 503 is applied to the acceleration electrode 405, and thermoelectrons are accelerated by the electric field generated by the acceleration electrode 406.

Figure 6:
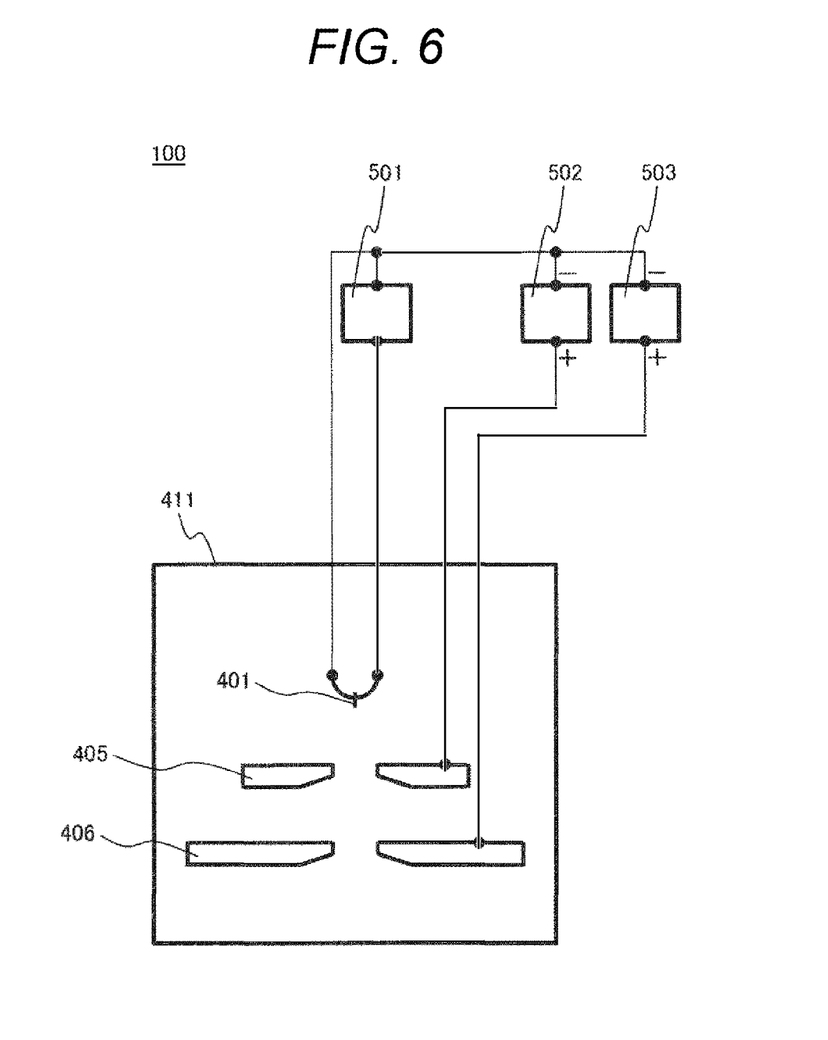
FIG. 6 is a diagram showing an electric circuit in a field emission electron gun.

A field emission electron gun utilizing the field emission phenomenon generally uses a tungsten single crystal as an emitter. The radius of curvature at the tip thereof is about 100 nm to create a strong electric field. Since the size of the emitter is as small as 5 to 10 nm, the field emission electron gun has an advantage of extremely high brightness, and is often used as an electron gun for high-resolution scanning electron microscopes. Since the energy width of the emitted electrons is small, the field emission electron gun has an advantage of easily obtaining high resolution even at a low acceleration voltage. Its disadvantages are as follows. Since the field emission electron gun operates at room temperature, the emission current may be likely to be unstable due to gas adsorption, and an ultra-high vacuum may be required. In addition, the impact of residual gas molecules ionized by emitted electrons may roughen the emitter surface and eventually destroy the emitter. In order to prevent this, instantaneous heating of the emitter referred to as flashing is sometimes performed. FIG. 6 is a diagram showing an electric circuit in the field emission electron gun. As shown in FIG. 6, the emitter 401, the extraction electrode 405, and the acceleration electrode 406 are stored in a vacuum container 411. A DC voltage of the extraction power source 502 is applied to the extraction electrode 405, and a high electric field is generated at the tip of the emitter 401. Electrons are generated by the high electric field at the tip of the emitter 401. Furthermore, the DC voltage of the acceleration power source 503 is applied to the acceleration electrode 406, and electrons are accelerated by the electric field generated by the acceleration electrode 406. The emitter of the field emission electron gun requires flashing and is instantaneously heated by the heating power source 501.

As described above, since the electron gun (electron beam generator) is installed in a vacuum, a current introduction terminal penetrating the vacuum container is required for applying a voltage to the electrodes. As an example thereof, the technique described in PTL 1 is known. In the micro focus X-ray generator exemplified in PTL 1, in the support body of the electron gun referred to as a high-voltage socket unit, a ceramic shell that emits less gas is arranged in the portion facing the vacuum side, and inside thereof, a pin electrode and a ring electrode to which a high voltage is applied are arranged in a structure in which they are embedded in epoxy resin. This structure has an advantage of allowing achieving electrical insulation and allowing reducing gas emission from the surface exposed to the vacuum side.

CITATION LIST

Patent Literature

PTL 1: JP 2002-25484 A

SUMMARY OF INVENTION

Technical Problem

However, when an electron gun whose emitter is heated, typified by a thermionic gun, a Schottky electron gun, or a field emission electron gun, is incorporated into the structure described in PTL 1, there is concern that the heat thereof is transferred to the epoxy resin, which causes thermal deterioration of the epoxy resin, and that the insulation reliability of the high-voltage socket unit is reduced.

Thus, the present invention provides a charged particle beam generator and a charged particle beam apparatus capable of improving insulation reliability by mitigating a high electric field generated around a connection portion of a conductor.

Solution to Problem

In order to solve the above problems, a charged particle beam generator according to the present invention includes:

a plug configured to introduce a high voltage from outside to a charged particle source in a vacuum; and a socket to which the charged particle source is attached. A field limiting ring electrically connected to only one of a plurality of high voltage introducing conductors is embedded inside a tip of the plug. The plurality of high voltage introducing conductors are arranged to penetrate the field limiting ring.

In addition, a charged particle beam apparatus according to the present invention is a charged particle beam apparatus configured to irradiate a sample with a charged particle beam, detect charged particles generated from the sample, and generate a sample image, the charged particle beam apparatus including: a plug configured to introduce a high voltage from outside to a charged particle source in a vacuum; and a charged particle beam generator including a socket to which the charged particle source is attached. The charged particle beam generator includes a field limiting ring electrically connected to only one of a plurality of high voltage introducing conductors inside a tip of the plug. The plurality of high voltage introducing conductors are arranged to penetrate the field limiting ring.

Advantageous Effects of Invention

According to the present invention, it is possible to provide a charged particle beam generator and a charged particle beam apparatus capable of improving insulation reliability by mitigating a high electric field generated around a connection portion of a conductor.

Problems, configurations, and effects other than those described above will be clarified by the following description of embodiments.

DESCRIPTION OF EMBODIMENTS

In the present specification, the charged particle beam generator includes an electron beam generator and an ion beam generator. In addition, the charged particle beam apparatus includes at least a scanning electron microscope (SEM), a scanning ion microscope (SIM), a transmission electron microscope (TEM), and a focused ion beam (FIB). Hereinafter, an electron beam generator will be described as the charged particle beam generator, and a scanning electron microscope (SEM) including the electron beam generator will be described as an example of the charged particle beam apparatus.

Hereinafter, embodiments of the present invention will be described with reference to the drawings.

First Embodiment

Figure 1:
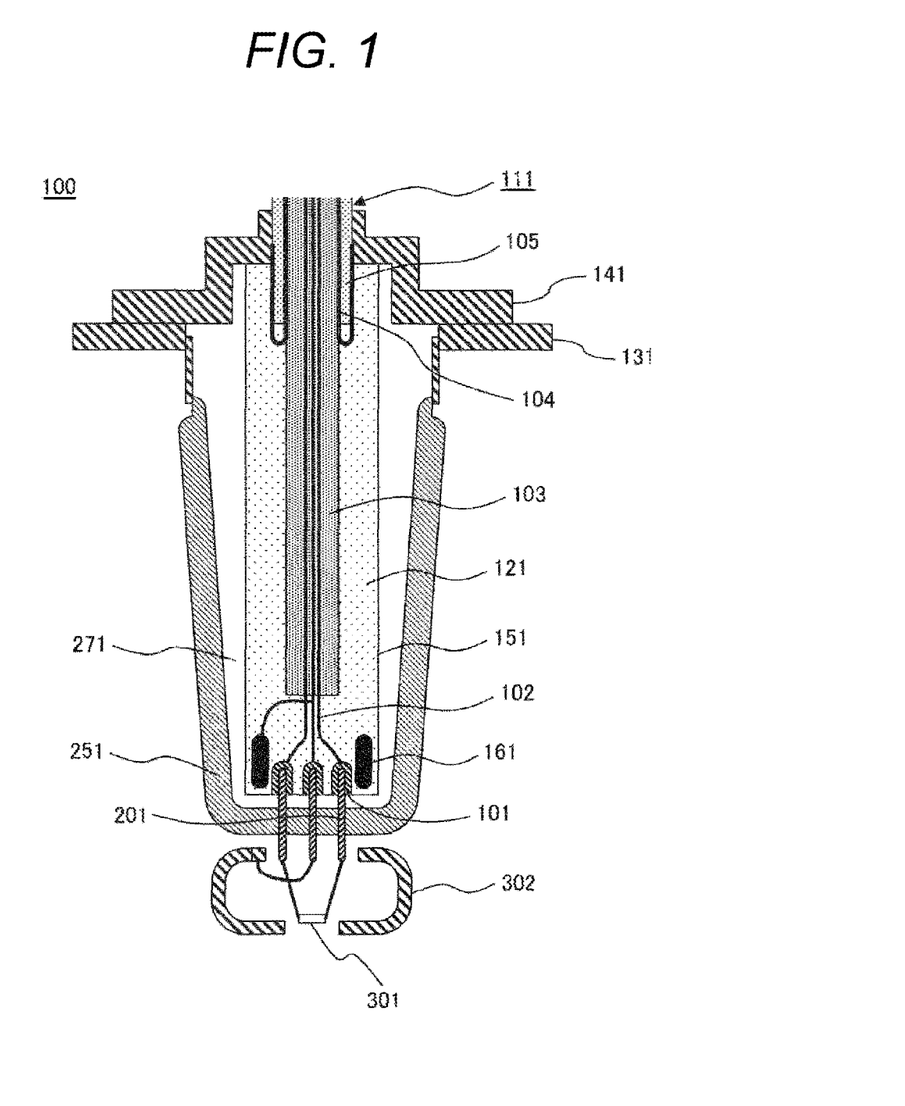
FIG. 1 is a cross-sectional view of a charged particle beam generator of a first embodiment according to one embodiment of the present invention.
Figure 2:
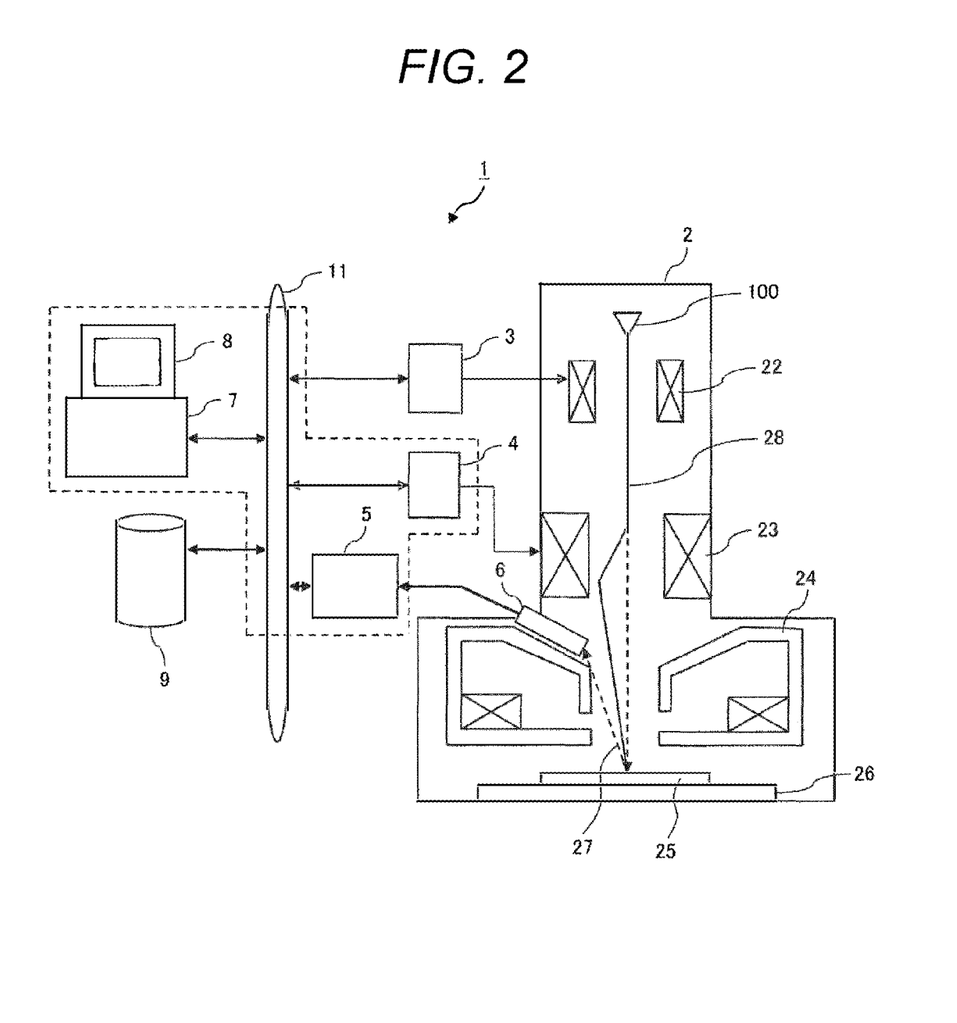
FIG. 2 is an overall schematic configuration diagram of a charged particle beam apparatus including the charged particle beam generator shown in FIG. 1.

FIG. 1 is a cross-sectional view of a charged particle beam generator (an electron beam generator as an example) of a first embodiment according to one embodiment of the present invention, and FIG. 2 is an overall schematic configuration diagram of a charged particle beam apparatus (a scanning electron microscope as an example) including the charged particle beam generator (electron beam generator) shown in FIG. 1.

As shown in FIG. 2, the scanning electron microscope as the charged particle beam apparatus 1 includes: an electron gun (charged particle beam generator) 100 for emitting primary electrons in a housing 2 maintained in a vacuum state by an evacuation system (not shown), a focusing lens 22 for focusing the primary electrons emitted from the electron gun (charged particle beam generator) 100 onto the surface of the sample 25 on a sample holding unit 26, a deflector 23 for deflecting the focused primary electron beam 28 so that the focused primary electron beam 28 can be two-dimensionally scanned on the sample 25, an objective lens 24, and a secondary electron detector 6 for detecting the secondary electrons 27 generated from the sample 25 by irradiation with the primary electron beam 28.

In addition, the scanning electron microscope includes: a focusing lens control unit 3 for controlling the voltage applied to the focusing lens 22, a deflection control unit 4 for controlling the deflector 23 based on the deflection amount of the primary electron beam 28 supplied from a control apparatus 7 as a command value, and a detection signal processing unit 5 for generating image data based on the signal from the secondary electron detector 6. Here, the secondary electron detector 6 includes a phosphor that emits light when the secondary electrons 27 generated from the sample 25 collide, and a photomultiplier tube that converts an optical signal into an electrical signal and amplifies it. It should be noted that a semiconductor detector or the like may be used as the secondary electron detector 6. In addition, the detection signal processing unit 5 includes: an amplifier that amplifies an electric signal from a photomultiplier tube (not shown), an A/D converter that converts the amplified electric signal into a digital signal, and an image forming unit that calculates the brightness at each pixel and generates image data based on the digital signal from the A/D converter and the deflection amount and scanning timing output from the deflection control unit 4 to the deflector 23.

Furthermore, the scanning electron microscope as the charged particle beam apparatus 1 includes, via a bus 11, a control apparatus 7 connected to the focusing lens control unit 3, the deflection control unit 4, the detection signal processing unit 5, and an external storage medium 9; and a display apparatus 8. The external storage medium 9 can store image data or pattern shape information (CAD data or the like) generated by the detection signal processing unit 5.

In FIG. 1, as the charged particle beam generator 100, a longitudinal sectional view of a thermionic gun is shown as an example, but the Schottky electron gun and the field emission electron gun also have the same structure.

As shown in FIG. 1, the electron gun as the charged particle beam generator 100 includes an emitter 301 and a Wehnelt cylinder 302. The electrical connection is as shown in FIG. 4 described above, and voltages are applied to both ends of the emitter 301 and to the Wehnelt cylinder 302 with three wiring lines. A high-voltage cable 111 is used to apply a voltage from a power source (not shown in FIG. 1) to the electron gun (charged particle beam generator) 100, but in consideration of installation and maintenance of the apparatus, it is necessary to remove the high-voltage cable 111, so that the electron gun 100 has a structure in which the plug 151 on the power source side is inserted into the socket 251.

A female terminal 101 is provided at the tip of the plug 151, and is electrically connected to a male terminal 201 on the socket 251 side. It should be noted that the female terminal 101 and the male terminal 201 may have opposite configurations. The plug 151 removes a sheath 105 of the high-voltage cable 111, folds the 104 back outside the sheath 105, exposes an insulator 103, and electrically connects the core wire 102 to the female terminal 101. That is, the shield 104 that covers the insulator 103 constituting the high-voltage cable 111 is folded back outside the sheath 105 along the outer circumference of the sheath 105. Since a high electric field may be generated at this portion, a conductive stress relief cone of any shape electrically connected to the shield 104 may be arranged to relax the electric field.

The female terminal 101 is electrically connected to the core wire 102 of the high-voltage cable 111. The core wire 102 is extracted from the high-voltage cable 111; the insulator 103 of the high-voltage cable 111, the shield 104 being at the ground potential, and the sheath 105 being the outer covering are removed; and the outside of the core wire 102 is covered with the resin 121; whereby the plug 151 is formed. The resin 121 is made of epoxy resin or engineering resin. The plug 151 is connected to the vacuum container 411 (FIG. 4) via a connection flange 131. In other words, connecting the connection flange 141 to the connection flange 131 of the vacuum container 411 connects the plug 151 to the vacuum container 411.

The outside of the socket 251 is vacuum. The socket 251 has a male terminal 201 penetrating therethrough, and is preferably made of ceramic having both insulation and airtightness. The socket 251 is connected to the vacuum container 411. The ceramic socket 251 and the male terminal 201 or the metal vacuum container 411 are connected while maintaining airtightness by silver brazing or welding.

A gap 271 exists between the plug 151 and the socket 251, and air or an insulating gas typified by SF6 (sulfur hexafluoride) is filled therein. Since the plug 151 and the socket 251 do not come into close contact with each other due to this gap 271, the heat generated by the electron gun, that is, the emitter 301 and the Wehnelt cylinder 302 is less likely to transfer to the plug 151, and the resin 121 of the plug 151 is less likely to be deteriorated by heat. It should be noted that the gap between the surface on which the female terminal 101 is arranged in the plug 151 and the inner surface on the side through which the male terminal 201 penetrates in the socket 251 is preferably about several mm, for example. In addition, the surface on which the female terminal 101 is arranged in the plug 151 and the inner surface on the side through which the male terminal 201 penetrates in the socket 251 have only not to be in contact with each other. In other words, the tip of the plug 151 and the inner surface of the socket 251 facing the tip of the plug 151 have only not to be in contact with each other.

A field limiting ring 161 is embedded in the tip of the plug 151 and electrically connected to any one of the core wires 102. The field limiting ring 161 has a donut shape and has an annular shape including an inner ring and an outer ring. The core wire 102 penetrates the inner ring (inside) of the field limiting ring 161. FIG. 1 shows a case where the field limiting ring 161 is electrically connected to the core wire 102 conducting to the Wehnelt cylinder 302. It should be noted that the present invention is not limited to this, and for example, any one of two conductors (two core wires 102 in FIG. 1) energized from the heating power source 501 at both ends of the emitter 401 shown in FIG. 4 and the field limiting ring 161 may be electrically connected. In other words, in FIG. 4, the field limiting ring 161 has only to be electrically connected only to any one conductor of two conductors (two core wires 102 in FIG. 1) energized from the heating power source 501 to both ends of the emitter 401 and one conductor (one core wire 102 in FIG. 1) energized from the extraction power source 502 to the Wehnelt cylinder 402. It should be noted that the field limiting ring 161 is desirably electrically connected to the core wire 102 conducting to the Wehnelt cylinder 302.

With the arrangement of the field limiting ring 161 as described above, the potentials of the core wire 102, the female terminal 101, the male terminal 201, and the Wehnelt cylinder 302 are close to each other, so that the electric field in the gap 271 around the male terminal 201 can be reduced to near zero, and discharge can be prevented.

In addition, with the above-described structure, the socket 251 can be made of a high heat-resistant material typified by ceramics and metals, and thermal deterioration of the socket 251 can also be prevented. The field limiting ring 161 is desirably made of a conductive metal. However, peeling may occur between the field limiting ring 161 and the resin 121, and a high electric field is generated in the peeled portion, so that the insulation reliability is reduced. Therefore, it is more desirable to apply conductive resin to the surface of the field limiting ring 161 made of metal. The conductive resin is obtained by adding metal powder or carbon powder to resin, and has a sufficiently higher conductivity than the resin 121. Generally, a conductive resin has higher adhesive force with a resin than with a metal. Therefore, even if applying a conductive resin to the field limiting ring 161 made of metal causes peeling to occur between the field limiting ring 161 and the insulator of the plug 151, since the peeling occurs between the field limiting ring 161 and the conductive resin and the peeled space is shielded by the conductive resin, the electric field in the space can be made zero, the problem of peeling can be solved, and the insulation reliability can be improved.

The electric field limiting ring 161 may be a molded product of conductive resin. In general, a conductive resin has high adhesive force with the resin 121 being an insulator of the plug 151, and peeling between the field limiting ring 161 and the resin 121 is less likely to occur, so that a high electric field is not generated between the field limiting ring 161 and the resin, and the insulation reliability can be improved.

It should be noted that in the present embodiment, the electron beam generator (electron gun) is described as an example of the charged particle beam generator 100, but when the present invention is applied to an ion source instead of the electron gun, in order to emit charged particles, mounting an ion species on the emitter 301 or the like allows an ion beam to be emitted and an ion source to be achieved.

As described above, according to the present embodiment, it is possible to provide a charged particle beam generator and a charged particle beam apparatus capable of improving insulation reliability by mitigating a high electric field generated around a connection portion of a conductor.

In addition, according to the present embodiment, since providing a gap 271 between the plug 151 and the socket 251 insulates heat with the gap 271, the heat generated by the charged particle beam generator 100 does not transfer to the plug 151, and it is possible to prevent deterioration in insulation reliability due to thermal deterioration of the plug 151.

In addition, according to the present embodiment, even if applying a conductive resin obtained by adding metal powder or carbon powder to resin to the surface of the field limiting ring 161 made of metal causes peeling to occur between the field limiting ring 161 and the insulator of the plug 151, since the peeling occurs between the field limiting ring 161 and the conductive resin and the peeled space is shielded by the conductive resin, the electric field in the space can be made zero and the insulation reliability can be improved.

In addition, according to the present embodiment, forming the field limiting ring 161 as a molded product of a conductive resin allows peeling between the field limiting ring 161 and the resin 121 to be prevented, and insulation reliability to be improved.

Second Embodiment

Figure 3:
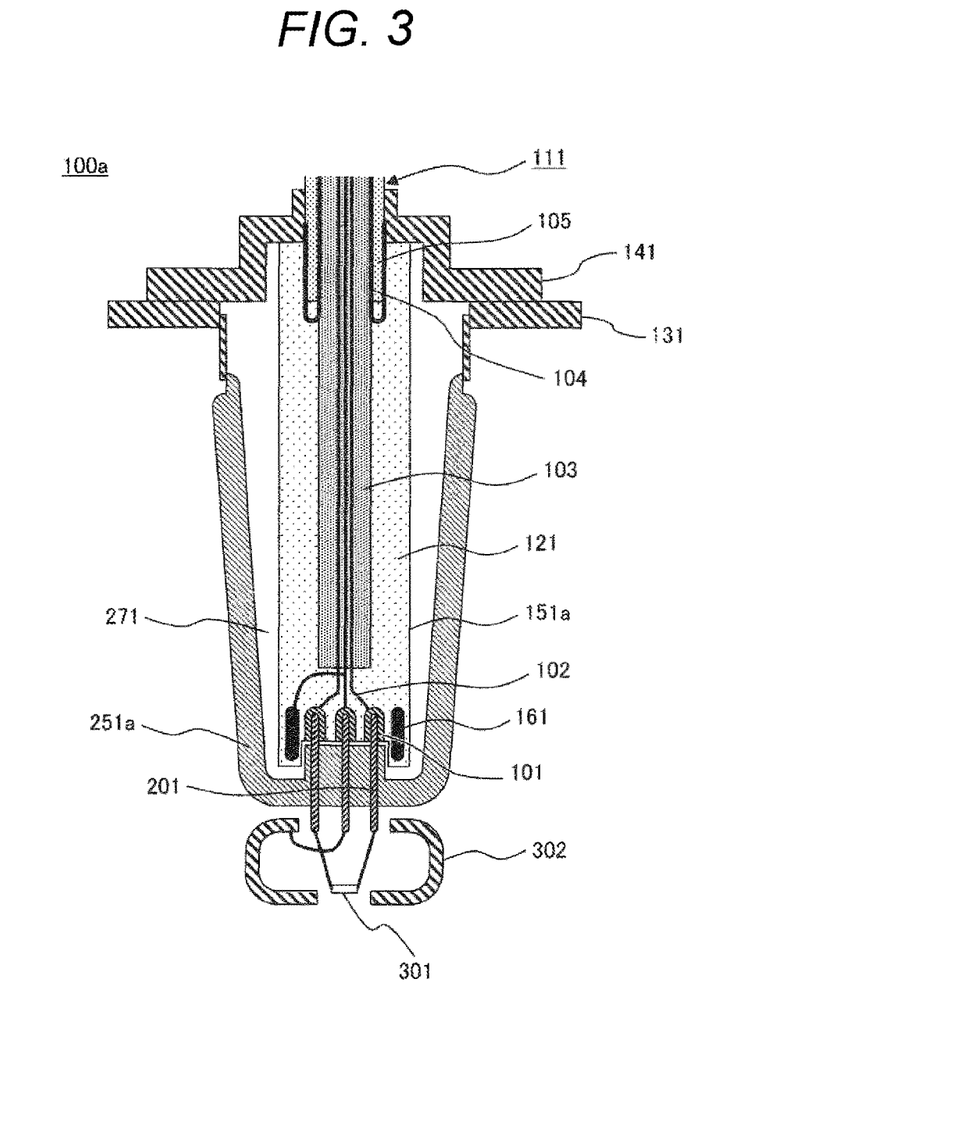
FIG. 3 is a cross-sectional view of a charged particle beam generator of a second embodiment according to another embodiment of the present invention.

FIG. 3 is a cross-sectional view of a charged particle beam generator of a second embodiment according to another embodiment of the present invention. The electron gun as the charged particle beam generator 100a of the present embodiment differs from that of the first embodiment in that the electron gun has a protruding portion, protruding toward the plug 151a side, at the portion through which the male terminal 201 penetrates of the socket 251a and part of the protruding portion is positioned inside (at the inner ring of) the field limiting ring 161. The same components as those of the first embodiment are denoted by the same reference numerals, and hereinafter, overlapping description will be omitted.

As shown in FIG. 3, the electron gun as the charged particle beam generator 100a of the present embodiment includes a protruding portion protruding to the plug 151a side at the portion through which the male terminal 201 penetrates of the socket 251a. Then, part of the protruding portion formed in the socket 251a is positioned inside (at the inner ring of) the field limiting ring 161. In other words, the inside of the field limiting ring 161 has a structure into which part of the socket 251a is inserted, and has a structure in which the connection portion between the female terminal 101 and the male terminal 201 is arranged in this portion. With this structure, arranging the connection portion between the female terminal 101 and the male terminal 201, at which a high electric field is generated, inside the field limiting ring 161 allows the electric field at the connection portion to be made almost zero and allows the insulation reliability to be improved.

It should be noted that FIG. 3 shows a case where the field limiting ring 161 is electrically connected to the core wire 102 conducting to the Wehnelt cylinder 302. It should be noted that the present invention is not limited to this, and for example, any one of two conductors (two core wires 102 in FIG. 1) energized from the heating power source 501 at both ends of the emitter 401 shown in FIG. 4 and the field limiting ring 161 may be electrically connected. In other words, in FIG. 4, the field limiting ring 161 has only to be electrically connected only to any one conductor of two conductors (two core wires 102 in FIG. 1) energized from the heating power source 501 to both ends of the emitter 401 and one conductor (one core wire 102 in FIG. 1) energized from the extraction power source 502 to the Wehnelt cylinder 402. It should be noted that the field limiting ring 161 is desirably electrically connected to the core wire 102 conducting to the Wehnelt cylinder 302.

In addition, in the present embodiment, the electron beam generator (electron gun) is described as an example of the charged particle beam generator 100a, but when the present invention is applied to an ion source instead of the electron gun, in order to emit charged particles, mounting an ion species on the emitter 301 or the like allows an ion beam to be emitted and an ion source to be achieved.

As described above, according to the present embodiment, in addition to the effects of the first embodiment described above, the connection portion between the female terminal 101 and the male terminal 201 where a high electric field is generated is arranged inside the field limiting ring 161, so that the electric field at the connection portion can be made almost zero, and the insulation reliability can be further improved as compared with that of the first embodiment.

It should be noted that the present invention is not limited to the embodiments described above, and includes various modifications. For example, the above-described embodiments are described in detail for easy understanding of the present invention, and are not necessarily limited to those including all the configurations described. In addition, part of the configuration of one embodiment can be replaced with the configuration of another embodiment, and the configuration of another embodiment can be added to the configuration of one embodiment.

REFERENCE SIGNS LIST 1 charged particle beam apparatus
2 housing
3 focusing lens control unit
4 deflection control unit
5 detection signal processing unit
6 secondary electron detector
7 control apparatus
8 display apparatus
9 external storage medium
10 recipe creation unit
12 image memory
22 focusing lens
23 deflector
24 objective lens
25 sample
26 sample holding unit
31 write address control unit
32 read address control unit
33 display control unit
100,100a charged particle beam generator
101 female terminal
102 core wire
103 insulator
104 shield
105 sheath
111 high-voltage cable
121 resin
131 connection flange
141 connection flange
151,151a plug
161 field limiting ring
201 male terminal
251,251a socket
271 gap
301 emitter 302 Wehnelt cylinder
401 emitter
402 Wehnelt cylinder
403 anode
404 suppressor
405 extraction electrode
406 acceleration electrode
411 vacuum container
501 heating power source
502 extraction power source
503 acceleration power source
504 suppressor power source

The invention claimed is:

1. A charged particle beam generator comprising:
a plug configured to introduce a high voltage from outside to a charged particle source in a vacuum; and
a socket to which the charged particle source is attached,
wherein a field limiting ring electrically connected to only one of a plurality of high voltage introducing conductors is embedded inside a tip of the plug, and
wherein the plurality of high voltage introducing conductors are arranged to penetrate the field limiting ring.

2. The charged particle beam generator according to claim 1, further comprising a gap between the tip of the plug and an inner surface of a socket facing the tip of the plug.

3. The charged particle beam generator according to claim 1, wherein the field limiting ring is made of metal and has a surface coated with a conductive resin.

4. The charged particle beam generator according to claim 2, wherein the field limiting ring is made of metal and has a surface coated with a conductive resin.

5. The charged particle beam generator according to claim 1, wherein the field limiting ring is a molded product made of a conductive resin.

6. The charged particle beam generator according to claim 2, wherein the field limiting ring is a molded product made of a conductive resin.

7. The charged particle beam generator according to claim 2,
further comprising a protruding portion on an inner surface of a socket facing the tip of the plug, the protruding portion configured to protrude to the tip of the plug, and
wherein part of the protruding portion is positioned inside the field limiting ring.

8. A charged particle beam apparatus configured to irradiate a sample with a charged particle beam, detect charged particles generated from the sample, and generate a sample image, the charged particle beam apparatus comprising:
a plug configured to introduce a high voltage from outside to a charged particle source in a vacuum; and
a charged particle beam generator including a socket to which the charged particle source is attached,
wherein the charged particle beam generator includes a field limiting ring electrically connected to only one of a plurality of high voltage introducing conductors inside a tip of the plug, and
wherein the plurality of high voltage introducing conductors are arranged to penetrate the field limiting ring.

9. The charged particle beam apparatus according to claim 8, further comprising a gap between the tip of the plug and an inner surface of a socket facing the tip of the plug.

10. The charged particle beam apparatus according to claim 8, wherein the field limiting ring is made of metal and has a surface coated with a conductive resin.

11. The charged particle beam apparatus according to claim 9, wherein the field limiting ring is made of metal and has a surface coated with a conductive resin.

12. The charged particle beam apparatus according to claim 8, wherein the field limiting ring is a molded product made of a conductive resin.

13. The charged particle beam apparatus according to claim 9, wherein the field limiting ring is a molded product made of a conductive resin.

14. The charged particle beam apparatus according to claim 9,
further comprising a protruding portion on an inner surface of a socket facing the tip of the plug, the protruding portion configured to protrude to the tip of the plug, and
wherein part of the protruding portion is positioned inside the field limiting ring.

* * * * *